United States Patent
Kanzaki et al.

(10) Patent No.: US 9,667,180 B2
(45) Date of Patent: May 30, 2017

(54) INVERTER

(71) Applicants: Takao Kanzaki, Miyoshi (JP); Tomoo Yamabuki, Nagoya (JP)

(72) Inventors: Takao Kanzaki, Miyoshi (JP); Tomoo Yamabuki, Nagoya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 14/763,035

(22) PCT Filed: Jan. 21, 2014

(86) PCT No.: PCT/IB2014/000059
§ 371 (c)(1),
(2) Date: Jul. 23, 2015

(87) PCT Pub. No.: WO2014/115017
PCT Pub. Date: Jul. 31, 2014

(65) Prior Publication Data
US 2015/0326156 A1  Nov. 12, 2015

(30) Foreign Application Priority Data
Jan. 25, 2013  (JP) ................ 2013-011950

(51) Int. Cl.
*H02P 27/04* (2016.01)
*H02P 6/12* (2006.01)
(Continued)

(52) U.S. Cl.
CPC ............. *H02P 6/12* (2013.01); *H02M 1/32* (2013.01); *H02M 7/537* (2013.01);
(Continued)

(58) Field of Classification Search
CPC ....................... H02P 27/08; H02M 7/53875
(Continued)

(56) References Cited

U.S. PATENT DOCUMENTS

2008/0197810 A1* 8/2008 Ishikawa ............... B60L 3/0007
 320/135
2010/0213904 A1* 8/2010 Yamada .................. B60L 3/003
 320/166
(Continued)

FOREIGN PATENT DOCUMENTS

CN 102742141 A 10/2012
JP 11-318085 A 11/1999
(Continued)

*Primary Examiner* — Rina Duda
(74) *Attorney, Agent, or Firm* — Sughrue Mion, PLLC

(57) ABSTRACT

An inverter includes a first series circuit in which a first switching element and a second switching element are connected in series; a capacitor connected in parallel to the first series circuit; a first current detection device that detects current that flows in the first series circuit; and a discharge test execution device that outputs a signal of bringing the first switching element and the second switching element to a conducting state, and that outputs a signal of switching one of the first switching element and the second switching element to a non-conducting state before predefined power flows in the first switching element, based on a detection result by the first current detection device.

8 Claims, 6 Drawing Sheets

(51) Int. Cl.
  *H02M 7/537* (2006.01)
  *H02P 27/06* (2006.01)
  *H02M 1/32* (2007.01)
  *H02M 7/5387* (2007.01)
  *G01R 31/34* (2006.01)
  *G01R 31/02* (2006.01)

(52) U.S. Cl.
  CPC ........ *H02M 7/53871* (2013.01); *H02P 27/06* (2013.01); *G01R 31/028* (2013.01); *G01R 31/343* (2013.01); *H02M 2001/322* (2013.01)

(58) Field of Classification Search
  USPC .......................................................... 318/801
  See application file for complete search history.

(56) References Cited

U.S. PATENT DOCUMENTS

| 2010/0214055 | A1* | 8/2010 | Fuji | B60L 3/00 340/3.1 |
| 2011/0120787 | A1* | 5/2011 | Lee | B60K 6/405 180/65.1 |
| 2011/0221374 | A1 | 9/2011 | Maebara et al. | |
| 2011/0278918 | A1 | 11/2011 | Shindo et al. | |
| 2012/0212160 | A1* | 8/2012 | Shindo | B60L 3/0007 318/139 |
| 2012/0320649 | A1* | 12/2012 | Hamanaka | H02M 7/48 363/131 |
| 2013/0049665 | A1* | 2/2013 | Oyobe | H02P 3/22 318/489 |
| 2013/0181731 | A1 | 7/2013 | Kanzaki et al. | |
| 2014/0095005 | A1 | 4/2014 | Kanzaki et al. | |

FOREIGN PATENT DOCUMENTS

| JP | 2001-320894 A | 11/2001 |
| JP | 2003-348856 A | 12/2003 |
| JP | 2004-357437 A | 12/2004 |
| JP | 2011-188713 A | 9/2011 |
| JP | 2013-146128 A | 7/2013 |
| WO | 2012/164680 A1 | 12/2012 |

* cited by examiner

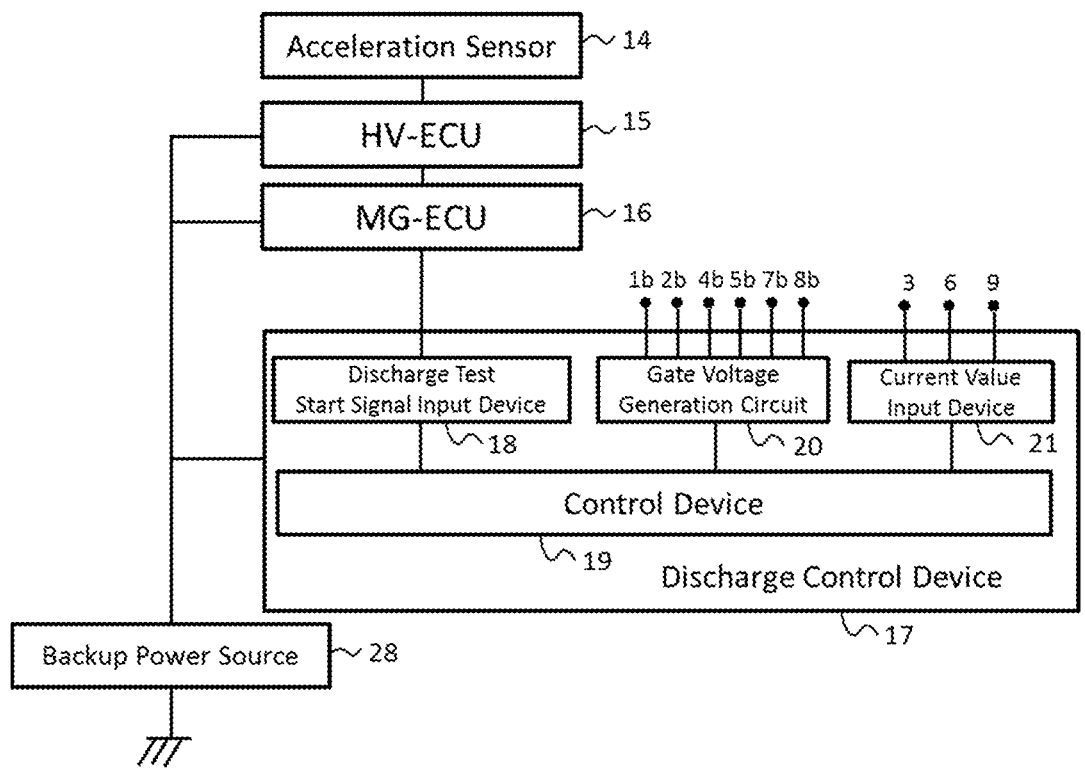
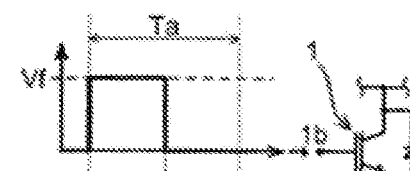
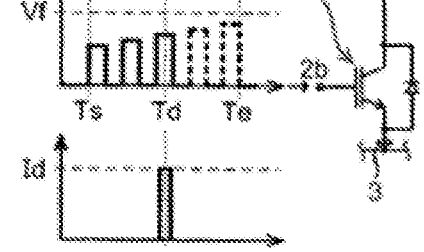

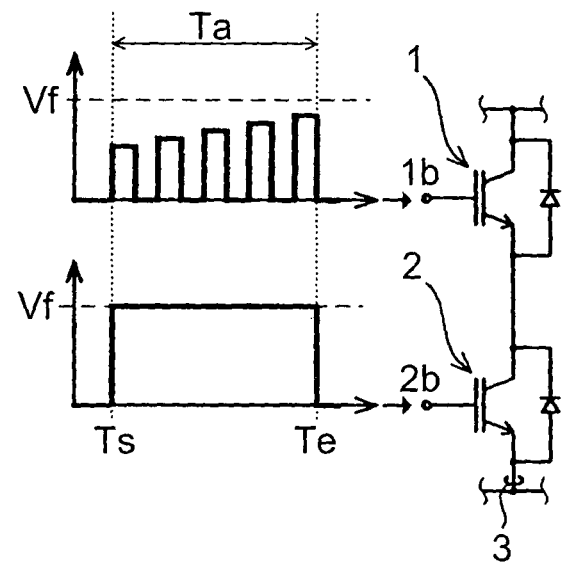
FIG. 5A
FIG. 5B
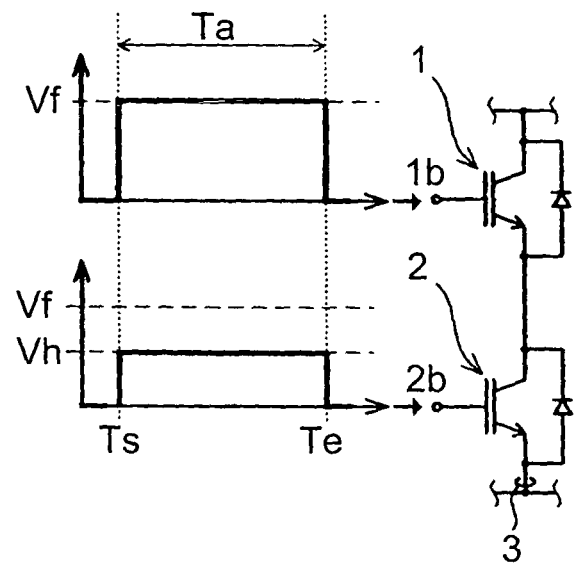
FIG. 6A
FIG. 6B

FIG. 7A
FIG. 7B
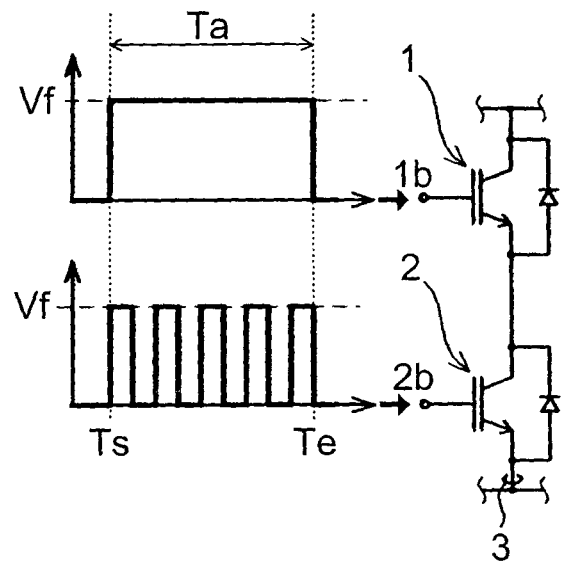
FIG. 8
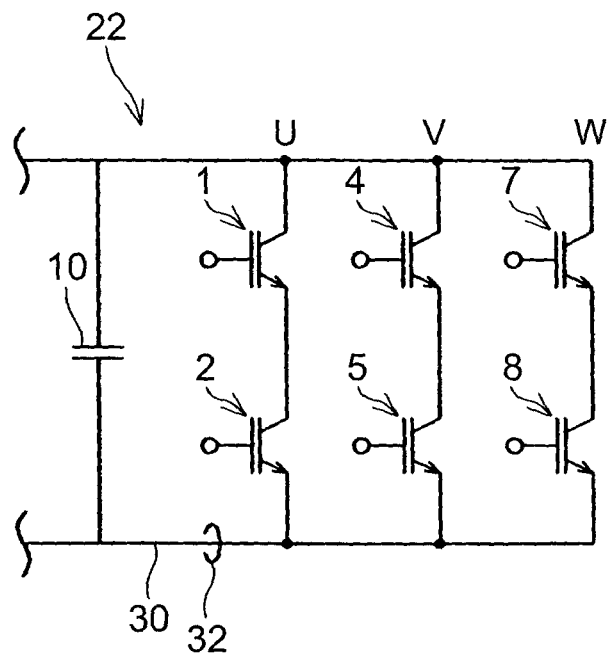

INVERTER

BACKGROUND OF THE INVENTION

1. Field of the Invention

The invention relates to an inverter that supplies alternate current (AC) power to an AC motor.

2. Description of Related Art

Inverters are provided with a capacitor that smoothes direct current (DC) voltage. The capacitor is charged using DC voltage, and is preferably discharged while the inverter is not used, or upon collision of a vehicle. For instance, an inverter that energizes a motor for travel, in an electric automobile or a hybrid automobile, is charged at high voltage. The capacitor must be discharged upon the occurrence of a collision accident or during servicing.

Japanese Patent Application Publication No. 11-318085 (JP 11-318085 A) discloses a technology in which a motor for travelling is used to discharge a capacitor. In this technology, a motor is caused to rotate, upon collision of a vehicle, using power stored in a capacitor; as a result, the electrical energy that is stored in the capacitor is dissipated by being converted to kinetic energy. That is, the capacitor is discharged.

The need to discharge the capacitor arises only in rare cases. However, discharge must take place reliably when required, although that is seldom the case, and must be tested on a routine basis. Preferably, for instance, a discharge test is performed on the capacitor at the start and at the end of the operation of the inverter, or if motor rotation is not necessary (in the case of a motor for travelling, at a period in which the shift lever is in the parking position or the brake pedal is depressed, and vehicle speed is accordingly zero), to check whether a discharge circuit is operating normally or not.

In the discharge test of the capacitor, however, causing the motor to rotate using the power stored in the capacitor may give rise to discomfort to occupants, on account of motor rotation under normal conditions, when there is no need to cause the motor to rotate. Even if braking is applied to motor, the user may still feel discomfort on account of a slight vibration from the motor, if the latter is energized.

SUMMARY OF THE INVENTION

The invention provides an inverter that allows performing a discharge test without causing a motor to rotate.

The inverter is provided with parallel branches in a number equal to the number of phases of AC power with which the motor is driven, such that at least two switching elements are provided in each of the branches. For instance, at least six switching elements are provided in an inverter that supplies three-phase AC. The switching elements in the respective branches generate AC power of a plurality of phases by being switched on/off at dissimilar timings. Typically, each branch is made up of a series circuit with two switching elements. A diode (wheeling diode) that allows current backflow is antiparallel-connected to each switching element. To discharge the capacitor that uses the motor, several of the switching elements in the inverter must be brought to a conducting state. The discharge test, therefore, is a test of checking whether or not the switching elements that are planned to be used for discharge do operate as planned or not (this check encompasses not only checking of the switching elements themselves, but also checking of whether the discharge circuit is operating normally or not). In order to check conduction of the switching elements without causing the motor to rotate, i.e. without supplying power to the motor, it suffices to apply an on signal to both switching elements of the series circuit (i.e. a control signal of bringing the switching elements to a conducting state), and to monitor whether current flows or not. Bringing both switching elements of the series circuit to a conducting state implies herein shorting the inverter, whereupon the switching elements rapidly generate heat as a result. The load (stress) that acts on the switching elements during the discharge test may promote deterioration of the switching elements. The invention provides a technology wherein the load (stress) that is exerted on the switching elements for discharge during a discharge test is curtailed, and deterioration of switching elements is not promoted as a result of the discharge test. The invention is effective in a case where switching elements for AC generation are also used for discharge control, but is likewise effective also in a case where discharge-dedicated switching elements are utilized.

An inverter according to an aspect of the invention includes: a first series circuit in which a first switching element and a second switching element are connected in series; a capacitor connected in parallel to the first series circuit; a first current detection device that detects current that flows in the first series circuit; and a discharge test execution device that outputs a signal of bringing the first switching element and the second switching element to a conducting state, and that outputs a signal of switching one of the first switching element and the second switching element to a non-conducting state before predefined power flows in the first switching element, based on a detection result by the first current detection device.

For convenience, the feature "supplying, to the gate of a switching element, a control signal for brining the switching element to a conducting state (non-conducting state)" may be expressed hereafter simply as bringing the switching element to a conducting state (non-conducting state).

The discharge circuit having the switching elements is confirmed to be operating normally as planned if the current detection device detects a predefined current upon application of the above control signal.

In the above aspect, both switching elements of the series circuit are brought to a conducting state simultaneously and temporarily, but the period involved is limited to a period over which there is no flow of power in an amount equal to or greater than predefined power amount. The load of the switching elements is reduced as a result.

The predefined power amount is established beforehand. Specifically, the predefined power amount may be established to an acceptable power amount when the series circuit is shorted. The power amount may be established based on the performance of the switching elements and based on the expected maximum amount of power that is stored in the capacitor.

In the above aspect, the discharge test execution device may output the signal of bringing the first switching element and the second switching element to the conducting state for a predetermined period, and may output a signal of switching one of the first switching element and the second switching element to the non-conducting state after the period established beforehand has elapsed.

The switching elements are confirmed to be operating normally if the current that flows during the period established beforehand is of a planned magnitude, while the switching elements are determined to not being operating normally if the magnitude is smaller than the planned magnitude.

To check whether the switching elements are in a normal condition or not, the period over which both switching elements are in a conducting state is preferably a long period. For convenience, the above period is referred to as "test period". However, the test period may be set to a short period in order to reduce the load (stress) acting on the switching elements when both switching elements are simply brought to a conducting state.

In the above aspect, the discharge test execution device may output a signal of operating the second switching element in such a manner that a resistance value of the second switching element in a conducting state is higher than a resistance value, during conduction, of the second switching element at the time of driving of a motor that is connected to the inverter, and is lower than a resistance value of the second switching element, during non-conduction, at the time of motor driving.

In the above aspect, the discharge test execution device may supply, to the second switching element, a control signal that causes the second switching element to be repeatedly in a conducting state and a non-conducting state.

The above aspect allows curtailing the amount of current that flows per unit time in a case where the first switching element is operating normally in response to the control signal. A long test period can be secured thereby. If a short test period is sufficient, conversely, the power amount that flows in the switching elements may be reduced, which in turn allows the load to be further reduced.

As described above, the inverter of the invention is provided with a circuit (discharge test execution device) that performs a discharge test of a capacitor for current smoothing. This circuit reduces the load of the switching elements in the discharge test.

The switching element positioned on the high-voltage side of the series circuit of the first switching element and the second switching element may be referred to as "upper arm", and the switching element positioned on the low-voltage side may be referred to as "lower arm". The designation "first switching element" and "second switching element" is used for convenience, to distinguish between two switching elements that are connected in series. The first switching element may thus be the upper arm switching element or the lower arm switching element.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 2 is a block diagram illustrating the system configuration of an inverter control device according to the embodiment of the invention;

FIG. 3A is a set of diagrams illustrating examples of waveforms (control signals) that are used in a discharge test according to the embodiment of the invention;

FIG. 3B is a set of diagrams illustrating examples of waveforms (control signals) that are used in a discharge test according to the embodiment of the invention;

FIG. 3C is a set of diagrams illustrating examples of waveforms (control signals) that are used in a discharge test according to the embodiment of the invention;

FIG. 5A is a set of diagrams illustrating a first variation of waveforms (control signals) that are used in a discharge test;

FIG. 5B is a set of diagrams illustrating a first variation of waveforms (control signals) that are used in a discharge test;

FIG. 6A is a set of diagrams illustrating a second variation of waveforms (control signals) that are used in a discharge test;

FIG. 6B is a set of diagrams illustrating a second variation of waveforms (control signals) that are used in a discharge test;

FIG. 7A is a set of diagrams illustrating a third variation of waveforms (control signals) that are used in a discharge test according to the embodiment of the invention;

FIG. 7B is a set of diagrams illustrating a third variation of waveforms (control signals) that are used in a discharge test according to the embodiment of the invention;

FIG. 8 is a diagram illustrating a variation of the configuration of an inverter.

DETAILED DESCRIPTION OF EMBODIMENTS

Figure 1:
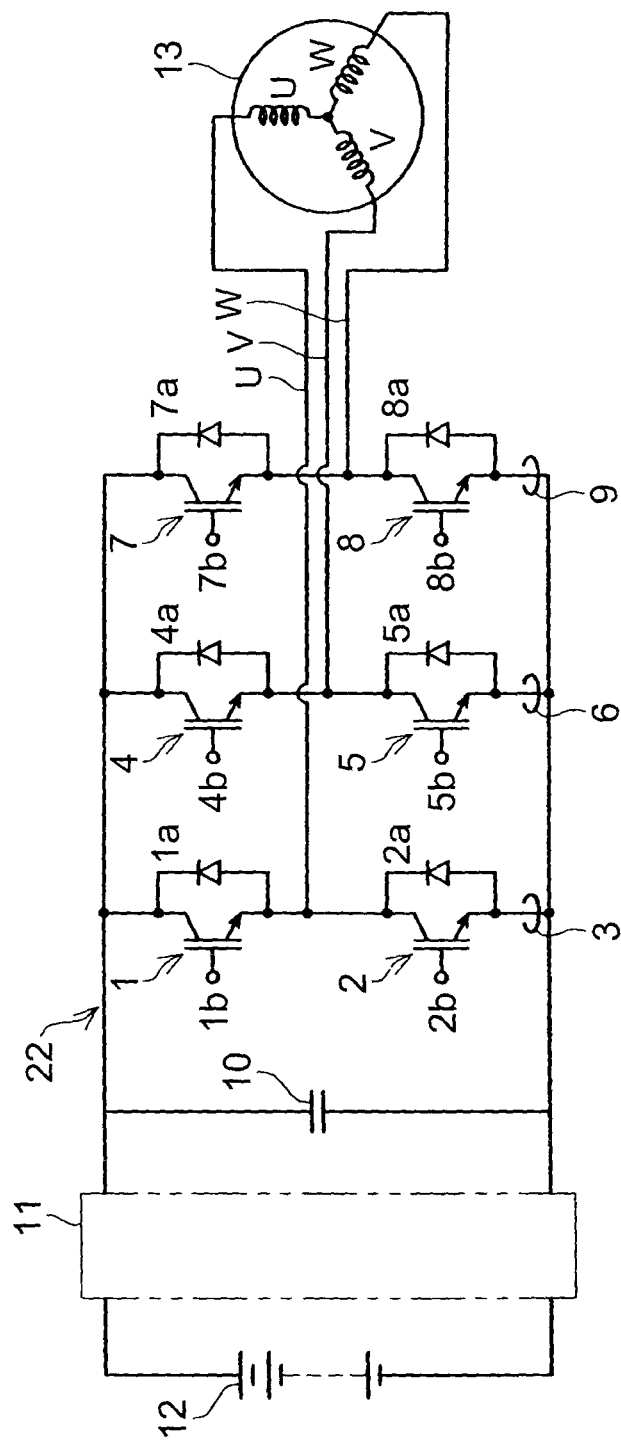
FIG. 1 is a block diagram illustrating the system configuration of an inverter according to an embodiment of the invention.

FIG. 1 illustrates a driving force generating device provided with a DC power source 12, an inverter 22 and a motor 13. The driving force generating device is installed in an electric automobile or a hybrid automobile. The automobile travels herein through rotation of a motor 13. Upon braking of the automobile, the motor 13 becomes a power generator that charges the DC power source 12. Although not shown in the figures, a system main relay that disconnects the DC power source 12 from the inverter 22 is inserted between the DC power source 12 and the inverter 22. A step-up circuit 11 may be inserted between the DC power source 12 and the inverter 22.

The inverter 22 is provided with a current smoothing capacitor 10. The inverter 22 generates U-, V-, W-phase AC current. The inverter 22 is provided with a U-phase upper arm switching element 1, a U-phase lower arm switching element 2, a U-phase current detection device 3, a V-phase upper arm switching element 4, a V-phase lower arm switching element 5, a V-phase current detection device 6, a W-phase upper arm switching element 7, a W-phase lower arm switching element 8 and a W-phase current detection device 9. The upper arm switching element and the lower arm switching element of each phase are connected in series. That is, the upper arm switching element and the lower arm switching element of each phase make up a respective series circuit.

A free-wheeling diode 1a is connected in parallel to the switching element 1, a free-wheeling diode 2a is connected in parallel to the switching element 2, a free-wheeling diode 4a is connected in parallel to the switching element 4, a free-wheeling diode 5a is connected in parallel to the switching element 5, a free-wheeling diode 7a is connected in parallel to the switching element 7, and a free-wheeling diode 8a is connected in parallel to the switching element 8.

A gate terminal 1b of the U-phase upper arm switching element 1, a gate terminal 2b of the U-phase lower arm switching element 2, a gate terminal 4b of the V-phase upper arm switching element 4, a gate terminal 5b of the V-phase lower arm switching element 5, a gate terminal 7b of the W-phase upper arm switching element 7 and a gate terminal 8b of the W-phase lower arm switching element 8 are connected to an inverter control device (not shown). The inverter control device has built thereinto a circuit that executes a discharge test.

The inverter control device generates three-phase alternating current, to energize thereby the motor 13, through switching on/off of the switching elements 1, 2, 4, 5, 7, 8 at dissimilar timings. The current waveform of the U-phase varies at a phase ahead of the current waveform of the V-phase by 120 degrees, and the current waveform of the W-phase varies at a phase lagging the current waveform of the V-phase by 120 degrees.

FIG. 2 illustrates a system configuration of the portion, in the inverter control device, that is involved in discharge control. The reference symbol 14 denotes an acceleration sensor. The acceleration sensor 14 is built into an airbag system, not shown, and generates a specific signal upon occurrence of a predefined acceleration in the vehicle. The acceleration threshold value that triggers generation of the specific signal is of a magnitude such that the signal cannot be generated upon ordinary travel of the vehicle, and is set to the magnitude of the acceleration that is predicted to arise upon occurrence of a vehicle collision. That is, the specific signal generated by the acceleration sensor 14 is a signal denoting that the vehicle seems to have collided. Such a signal will be referred to hereafter as collision signal.

The inverter control device discharges the capacitor 10 upon reception of the collision signal from the acceleration sensor 14. To that end, the signal from the acceleration sensor 14 is inputted to a motor-generator (MG)-electronic control unit (ECU) 16 via a hybrid vehicle (HV)-ECU 15. Upon input of the collision signal, the MG-ECU 16 operates a discharge control device 17. In this case, the discharge control device 17 (or a separate control device such as the HV-ECU 15) releases the system main relay, to thereby disconnect the DC power source 12 from the inverter 22 and to discharge the capacitor 10. The discharge control device 17 turns on any one of the upper arm switching elements of the U-phase, V-phase and the W-phase (any one of the switching elements 1, 4, 7) and turns on the lower arm switching elements (any one of the switching elements 2, 5, 8) of phases different from the phases of the turned-on upper arms. Thereupon, the power that is stored in the capacitor 10 flows to the motor 13 via the inverter 22. Specifically, the electrical energy stored in the capacitor 10 is dissipated in the form of rotational energy of the motor or thermal energy in the coils of the motor.

The discharge circuit of the capacitor 10 must operate also in the case of a vehicle collision. During discharge of the capacitor 10, therefore, power is supplied by a backup power source 28 to the HV-ECU 15, the MG-ECU 16 and the discharge control device 17. Alternatively, control may be performed in such a manner that power supply by the backup power source 28 is limited to the discharge control device 17, supply of power to the HV-ECU 15 and/or the MG-ECU 16 is cut off, and discharge takes place at the time of residual charge in the capacitor.

Apart from that, the HV-ECU 15 selects a period that is suitable for testing, for instance at the start of the operation of the automobile, at the end of the operation of the automobile, or at a period in which the motor 13 needs not be caused to rotate (period in which the shift lever is in the parking position or the brake pedal is depressed, and vehicle speed is accordingly zero), and outputs a discharge test start command. The discharge control device 17 executes the discharge test upon input of the discharge test start command from the HV-ECU 15 to the MG-ECU 16. Power from the backup power source 28 may be set to be supplied to the HV-ECU 15, the MG-ECU 16 and the discharge control device 17 also in the case of the discharge test. In such a case, the discharge test includes a check on whether power feeding by the backup power source 28 is in a normal condition or not.

If a discharge test is executed, the discharge control device 17 applies the gate voltage (control signal) illustrated in FIG. 3A to the gate terminal 1b of the switching element 1. The gate voltage is a voltage Vf such that the on-resistance between the emitter and the collector of the switching element 1 is sufficiently reduced. In other words, the gate voltage Vf is identical to the voltage at which the switching elements are turned on during motor driving in ordinary travel. In some instances, the voltage Vf such that the on-resistance between the emitter and the collector of the switching element 1 is sufficiently lowered is referred to as full-on voltage Vf. That denomination designates a voltage that is sufficient for eliciting full conduction in the switching element 2.

In the embodiment, the switching element 1 corresponds to a first switching element. In the embodiment, insulated gate bipolar transistors (IGBTs) are used as the switching elements 1, 2, 4, 5, 7, 8. The technology of the embodiment is not limited to cases where IGBTs are utilized, and is useful also in cases where some other switching elements are used, for instance a metal-oxide-semiconductor (MOS) transistors or the like. The switching element 2 corresponds to a second switching element. The control signal that is applied to the gate terminal 1b of the first switching element 1 in the discharge test (signal illustrated in FIG. 3A in the embodiment) will be referred to hereafter as first control signal. The control signal that is applied to the gate terminal 2b of the second switching element 2 (signal illustrated in FIG. 3B in the embodiment) will be referred to hereafter as second control signal. For instance, the first switching element 1 is a switching element that is used for discharge of the capacitor 10, and the second switching element 2 is a switching element that is operated in order to confirm that the first switching element 1 is operating normally during discharge.

In the execution of the discharge test, the discharge control device 17 supplies the gate voltage illustrated in FIG. 3B (second control signal) to the gate terminal 2b of the second switching element 2. The gate voltage is set to a relationship such that the voltage rises with the passage of time. That is, an upper limit voltage is kept to a magnitude that is lower than that of the full-on voltage Vf explained above. At such voltage, the resistance value of the switching element 2 is higher than the resistance value, during conduction, of the switching element 2 at the time of driving of the motor 13 that is connected to the inverter 22, and is lower than the resistance value of the switching element 2 during non-conduction at the time of motor driving. Such voltage is also referred to hereafter as half-on voltage. That denomination designates a voltage such that the current that flows between the emitter and the collector of the switching element 2 is smaller than during application of the full-on voltage Vf.

A gate voltage (FIG. 3B) such that the voltage rises in a step-wise manner is used in the embodiment, but a voltage may be applied that rises continuously with the passage of time. The voltage used in the embodiment becomes zero temporarily as the voltage varies step-wise. However, voltage that is not zero at any period may also be utilized in the embodiment. Voltage that varies step-wise is readily generated by a logic circuit.

As the gate voltage of the second switching element 2 is raised, with the first switching element 1 in a conducting state (low resistance state), the second switching element 2 exhibits initially high resistance and no current flows in the U-phase. As the gate voltage of the second switching element 2 rises, however, the resistance of the second switching element 2 decreases, and current (discharge current) starts to flow in the U-phase. The current value at the time where the current starts to flow is small. FIG. 3C illustrates a current value Id at that time. The flow of the small discharge current Id is detected by the U-phase current detection device 3. The circuit through which the capacitor 10 that uses the U-phase is discharged can prove to be in a normal condition if the current Id is detected by the U-phase current detection device 3. In particular, the switching element 1 (first switching element) that is used for discharge can be confirmed to being operating normally. In consequence, the test need not be continued any further, and, accordingly, the test is terminated. The value Id of current that flows in the first switching element 1 and the second switching element 2 in the test (discharge test) for confirming that the discharge circuit that uses the U-phase is operating normally takes on a small value. That is, no excessive stress is applied to the first switching element 1 or the second switching element 2 in the discharge test.

The same test is conducted for the V-phase and the W-phase in cases where discharge control is performed using V-phase and W-phase switching elements. The discharge circuit that utilizes the V-phase can prove to be in a normal condition if current is detected by the V-phase current detection device 6, and a power control unit (PCU) discharge circuit that utilizes the W-phase can prove to be in a normal condition if current is detected by the W-phase current detection device 9.

The U-phase, the V-phase and the W-phase may be checked simultaneously. Therefore, the gate voltage that is applied to the second switching element of each phase is caused to keep on rising until current is detected by all of the U-phase current detection device 3, the V-phase current detection device 6 and the W-phase current detection device 9. If the discharge circuit is abnormality-free, the current Id is detected by all of the U-phase current detection device 3, the V-phase current detection device 6 and the W-phase current detection device 9 at an early stage. At this stage, the current that flows in the switching elements in any of the U-phase, the V-phase and the W-phase, is a low current. It becomes thus possible to execute the discharge test while suppressing the load that is applied to all the switching elements.

If the current Id is detected by all of the U-phase current detection device 3, the V-phase current detection device 6 and the W-phase current detection device 9, the first control signal that is applied to the first switching element of each phase is set to zero, and the second control signal that is applied to the second switching element is set to zero. The dashed lines illustrated in FIGS. 3A and 3B denote a planned first control signal (FIG. 3A) and a planned second control signal (FIG. 3B). The voltage of the second control signal rises with the passage of time. The upper limit thereof is set to a value that is lower than that of the full-on voltage Vf. The initial value of the voltage of the second control signal, as well as the increment in voltage at each step, are established beforehand. Therefore, the period elapsing from the start of the discharge test until the voltage takes on a value that is lower than that of the full-on voltage Vf can be grasped beforehand. This period is the period denoted by the reference symbol Ta illustrated in FIG. 3A. In FIGS. 3A to 3C, the discharge test is initiated at time Ts, and time Te is a point in time planned for discharge test termination after the period Ta has elapsed. If the discharge current Id of the U-phase is detected at time Td before the discharge test termination time Te, the discharge test is terminated at that point in time, and the first control signal and the second control signal and both set to zero. If current is not detected by any one of the U-phase current detection device 3, the V-phase current detection device 6 and the W-phase current detection device 9, there is diagnosed an abnormality in the discharge circuit of that phase, even if time Te is reached after the period Ta has elapsed. The solid line in FIG. 3B denotes an instance where the discharge circuit is not in an abnormal condition. Once the discharge current Id illustrated in FIG. 3C is detected by all of the U-phase current detection device 3, the V-phase current detection device 6 and the W-phase current detection device 9, the first control signal that applied to the first switching element of each phase is set to zero, and also the second control signal that is applied to the second switching element of each phase is set to zero. Accordingly, the discharge test is terminated while the power amount that flows in each switching element is small.

If the discharge circuit is in a normal condition, the magnitude of the current that is likely to flow into each switching element is already obtained when the first control signal and the second control signal are applied to a respective switching element. The magnitude of the maximum voltage of the second control signal that is applied step-wise and the discharge test period Ta are established in accordance with the relationship below. Specifically, the magnitude of the maximum voltage of the second control signal, as well as the discharge test period Ta, are established to values such that deterioration of the switching elements is not promoted by the load (stress) that is exerted on the first switching element (second switching element) on account of the amount of power that flows in the first switching element (second switching element) when the discharge circuit is in a normal condition and there are applied first and second control signals that are planned for the duration of the discharge test period Ta. In other words, the above feature involves the following. The discharge control device 17 that executes the discharge test brings the first switching element and the second switching element to a conducting state, and brings one of the first switching element and the second switching element to a non-conducting state before predefined power flows in the first switching element. The "predefined power" may be set to power such that the first and the second switching elements undergo no deterioration, as described above. The same effect can be elicited if, in the above expression, the feature "before predefined power flows in first switching element" is set to "before predefined power flows in the second switching element". There is no need for the discharge test execution device 17 to maintain the switching elements in a conducting state until a predefined amount of power flows in the series circuit. The discharge test execution device 17 may terminate the discharge test by bringing any one of the switching elements to a non-conducting state, at the point in time at which each switching element is confirmed to be operating normally.

The discharge control device 17 is provided with: a device 18 to which there is inputted a discharge test start signal from the MG-ECU 16; a control device 19; a device 21 that inputs, to the control device 19, detection values of the U-phase current detection device 3, the V-phase current detection device 6 and the W-phase current detection device 9; and a gate voltage generation circuit 20 that generates control signals that are applied to the gates of the first switching elements and the gates of the second switching elements, in response to an instruction by the control device 19.

For the U-phase, either the switching element 1 or the switching element 2 functions as the first switching element, and the other functions as the second switching element. For the V-phase, similarly, either the switching element 4 or the switching element 5 functions as the first switching element, and the other functions as the second switching element. For the W-phase, similarly, either the switching element 7 or the switching element 8 functions as the first switching element, and the other functions as the second switching element. In the above example, the switching element 1 functions as the first switching element, and the switching element 2 functions as the second switching element.

Figure 4:
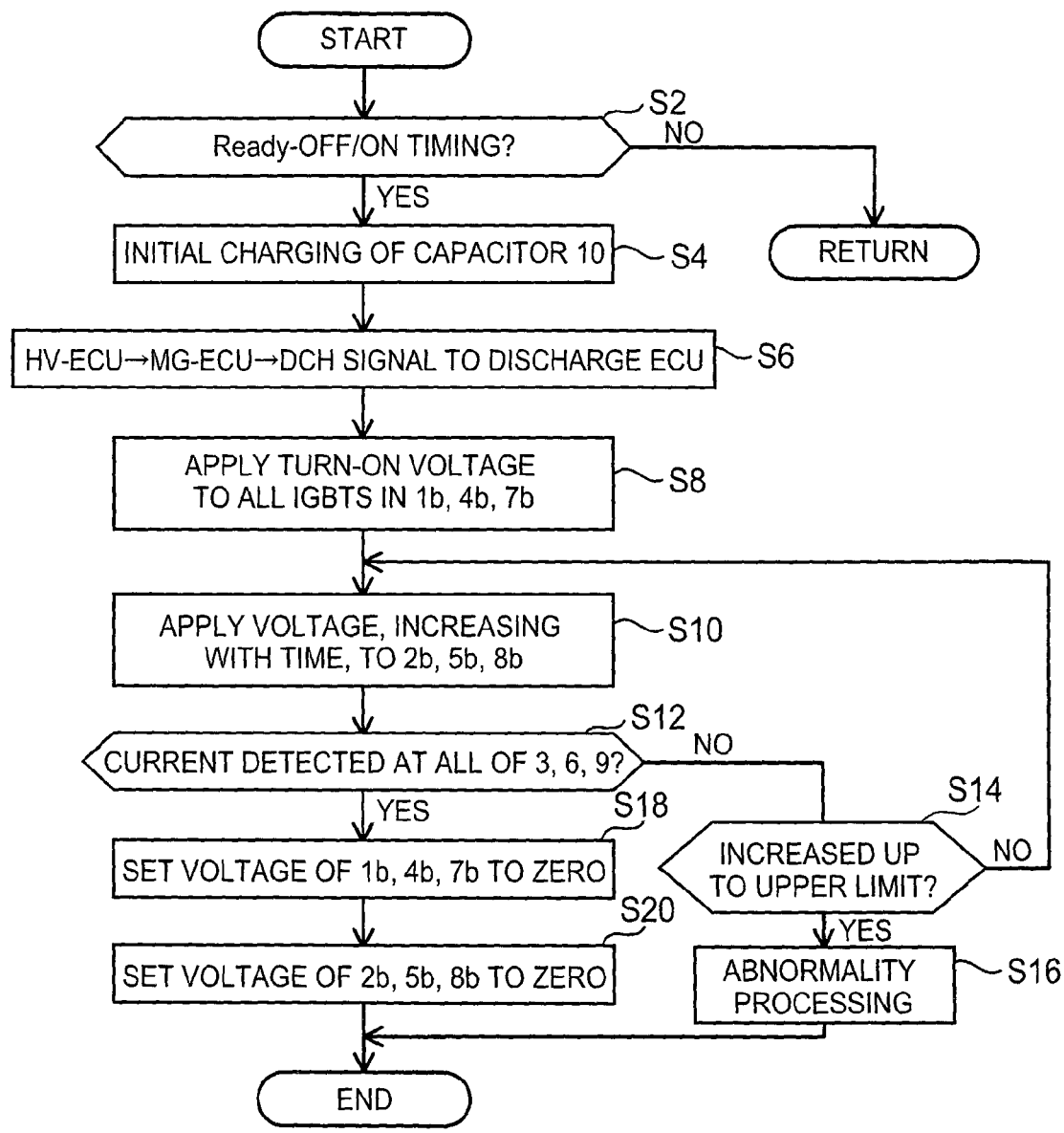
FIG. 4 is a flowchart diagram illustrating process steps performed by a discharge control device according to the embodiment of the invention.

FIG. 4 illustrates an example of process steps upon execution of a discharge test. The process in the flowchart of FIG. 4 is executed mainly in the discharge control device 17. Step S2 is a process of monitoring the reaching of the execution timing of the discharge test, and involves monitoring the reaching of the timing at which a switch (ready switch) of the automobile changes over from off to on. In the embodiment, the discharge test is performed at the time when the automobile use starts. The timing at which the discharge test is performed is not limited to the time when which the automobile use starts. In the explanation below, the switching elements 1, 4, 7 function as the first switching element, and the switching elements 2, 5, 8 function as the second switching element.

Steps from step S4 onwards are performed during execution of the discharge test. In step S4, the capacitor 10 is charged initially, to bring about a state in which the discharge test can take place. In step S6, the HV-ECU 15 outputs a dedicated channel (DCH) signal that is inputted to the MG-ECU 16. The DCH signal is a start command of the discharge test. The power source that enables operation of the HV-ECU 15, the MG-ECU 16 and the discharge control device 17 may be then switched over from the DC power source 12 to the backup power source 28.

In step S8, voltage (full-on voltage Vf) of a magnitude such that the on-resistance of the first switching elements 1, 4, 7 is sufficiently lowered is applied to the gate terminals 1*b*, 4*b*, 7*b* of the first switching elements 1, 4, 7. This gate signal corresponds to the above-described first control signal. The first switching elements 1, 4, 7 are at low resistance if the discharge circuit is in a normal condition.

In step S10, the second control signal is applied to the gate terminals 2*b*, 5*b*, 8*b* of the second switching elements 2, 5, 8. The voltage of the second control signal rises as time elapses, as illustrated in FIG. 3B. The maximum value of the signal is lower than that of the full-on voltage Vf, and the period Ta over which voltage is applied is limited beforehand.

In step S12, it is determined whether or not the discharge current is detected by all of the U-phase current detection device 3, the V-phase current detection device 6 and the W-phase current detection device 9. If the discharge circuit is in a normal condition, the determination result in step S12 yields YES as step S12 is repeated. If the discharge circuit is in a normal condition, then the first control signal that is applied to the first switching elements 1, 4, 7 is set to zero in step S18, the second control signal that is applied to the second switching elements 2, 5, 8 is set to zero in step S20, and the discharge circuit is terminated. Once the initial inspection is over, the automobile is brought to a state in which the automobile can be normally used. The power source of the HV-ECU 15, the MG-ECU 16 and the discharge control device 17 is returned from the backup power source 28 to the DC power source 12.

While step S12 yields NO, the process is returned to NO step S10, and the above steps are repeated (step S14: NO). The voltage of the second control signal rises steadily with each repetition. If an abnormality has occurred in the discharge circuit, step S12 does not yield YES even if the second control signal is raised up to the upper limit value. If step S14 yields YES, this means that an abnormality has occurred in the discharge circuit. Abnormality processing is then performed accordingly in step S16. As described above, the upper limit value of the second control signal uniquely corresponds to the discharge test period Ta. Therefore, the determination in step S14 is equivalent determining "discharge period Ta elapsed?". The process in this case corresponds to the "in the default period (period Ta), the first switching element and the second switching element are switched to a conducting state, and after the default period, one of the first switching element and the second switching element is switched to a non-conducting state".

In the embodiment, the discharge tests for the U-phase, the V-phase and the W-phase are performed simultaneously. Each phase can be tested since the U-phase current detection device 3, the V-phase current detection device 6 and the W-phase current detection device 9 are used herein. If there is an abnormality, it becomes possible thus to specify the phase for which the abnormality has been detected.

(Variation 1)

As illustrated in FIGS. 5A and 5B, the switching element on the negative electrode side (lower arm switching element 2) may be used as the first switching element, and the switching element on the positive electrode side (upper arm switching element 1) may be used as the second switching element. Specifically, the full-on voltage Vf (FIG. 5B) may be applied to the gate terminal 2*b* of the switching element 2, and voltage that increases at every step (FIG. 5A) may be applied to the gate terminal 1*b* of the switching element 1. The same is true of the V-phase and the W-phase.

(Variation 2)

As illustrated in FIGS. 6A and 6B, the full-on voltage Vf may be applied to the gate terminal 1*b* of the first switching element 1, and a half-on voltage Vh that is lower than the full-on voltage Vf may be applied to the gate terminal 2*b* of the second switching element 2. The half-on voltage Vh is a control signal such that the resistance value of the second switching element 2 in a conducting state is higher than the resistance value, during conduction, of the second switching element 2 at the time of driving of the motor 13, but the resistance value of the second switching element 2 in this state is lower than the resistance value of the second switching element 2, during non-conduction, at the time of motor driving. When such a control signal is applied, the current that flows in the switching elements in a case where the discharge circuit is in a normal condition is smaller than in a case where the full-on voltage Vf is applied to the gate terminals of both the first and the second switching elements. It becomes therefore possible to curtail the load (stress) that acts upon the switching elements in the discharge test. In this variation as well, the test period Ta is established to a value such that if the discharge circuit is in a normal condition, deterioration of the switching elements is not promoted by the power that flows during the period Ta. After the test period Ta is over, both the first and the second control signals are set to zero, and the first switching element 1 and the second switching element 2 are both brought to a non-conducting state. In the discharge test, in other words, the discharge control device 17 brings the first switching element 1 and the second switching element 2 to a conducting state, and switches at least one of the first switching element 1 and the second switching element 2 to a non-conducting state before predefined power flows in the first switching element 1. The same applies to the V-phase and the W-phase.

(Variation 3)

As illustrated in FIGS. 7A and 7B, a control signal (first control signal) of the full-on voltage Vf may be applied to the gate terminal 1b of the first switching element 1, and a pulsed control signal (second control signal) of the full-on voltage Vf may be applied to the gate terminal 2b of the second switching element 2. Herein control signals of the full-on voltage Vf are applied to both the first and the second switching elements, but a pulsed control signal is applied to one of the switching elements. Accordingly, the power that flows through the switching element over the predefined period Ta is smaller than in a case where a constant full-on voltage Vf is applied to both switching elements, even if the discharge circuit is in a normal condition. When for instance a pulsed full-on voltage Vf of a duty ratio of 50% is applied, the power that flows in the switching elements is halved with respect to that when the duty ratio is 100%. The test period Ta is established according to a condition whereby deterioration of the switching elements is not promoted by power that flows in the switching elements, when the discharge circuit is in a normal condition and a constant full-on voltage Vf is applied to the gate of one of the switching elements and a pulsed full-on voltage Vf is applied to the gate voltage of the other switching element.

(Variation 4)

The gate voltage for testing (first and second control signals) need not be applied to the switching elements of all phases, for the purpose of testing, if the phase that is used for discharge of the capacitor 10 is prescribed from among the U-phase, the V-phase and the W-phase. It suffices to apply the gate voltage for testing only to the switching element of the energized phase that is used for discharge.

(Variation 5)

The discharge test can be performed for each phase also in a case where discharge involves the switching elements of all phases. For instance, the discharge test may be performed in the order U-phase test, V-phase test and W-phase test. In this case, it suffices to arrange one current detection device 32 in a wiring section that is phase-independent, namely a common wiring section 30 (common ground line) of the inverter 22, as illustrated in FIG. 8.

Figure 9:
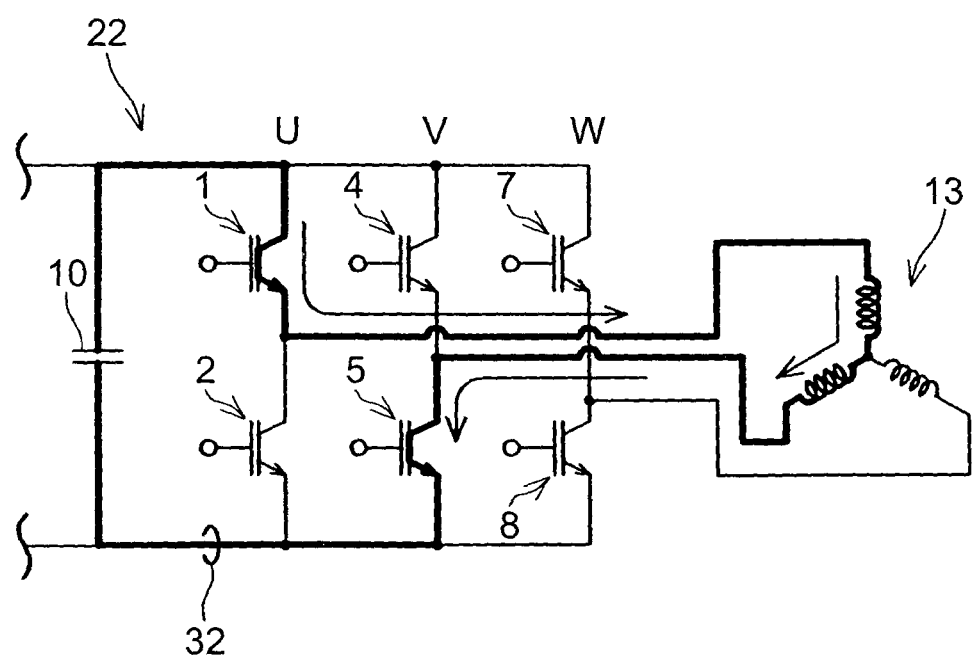
FIG. 9 is a diagram for explaining a capacitor discharge process.

The discharge process of the capacitor 10 is explained next. In the case not of a discharge test but of actual discharge of the capacitor 10, the upper arm switching element and lower arm switching element of identical phase, namely both switching elements of the series circuit, are not brought to a conducting state; instead, the upper arm switching element of the first series circuit, from among the three series circuits (U-phase, V-phase and W-phase) that are connected in parallel, is brought to a conducting state, and the lower arm switching element of a second series circuit different from the first series circuit is brought to a conducting state. FIG. 9 illustrates the flow of current at the time of capacitor discharge. The bold line denotes the current path. In the case of FIG. 9, the discharge control device 17 brings the upper arm switching element 1 of the U-phase and the lower arm switching element 5 of the V-phase to a conducting state. Thereupon, power stored in the capacitor 10 passes through the switching element 1, passes next through the coils of the motor 13, and passes then through the lower arm switching element 5 of the V-phase. The power stored in the capacitor 10 passes through the coils of the motor 13. That is, the power stored in the capacitor 10 is dissipated in the form of torque in the motor 13 and heat generated in the coils of the motor 13. The power stored in the capacitor 10 is thus expended quickly. As described above, in a case where the upper arm switching element 1 of the U-phase and the lower arm switching element 5 of the V-phase are used for discharge, the switching elements that are targeted in the discharge test are the switching elements 1 and 5. In such a case, the switching element 1 functions as the first switching element and the switching element 2 functions as the second switching element, in the U-phase. In the V-phase, the switching element 5 functions as the first switching element and the switching element 4 functions as the second switching element. Discharge in which the motor is resorted to is realized also for instances other than a combination of the U-phase upper arm switching element and the V-phase lower arm switching element, as described above.

Points to remember regarding the features explained in the embodiments include the following. The discharge control device 17 of the embodiment corresponds to an example of the discharge test execution device. The inverter of the embodiment is installed in an electric automobile. The features disclosed in the description may be applied to inverters of HVs having installed therein both a motor and an engine for travel.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

The invention claimed is:

1. An inverter, comprising:
   a first series circuit in which a first switching element and a second switching element are connected in series;
   a capacitor connected in parallel to the first series circuit;
   a first current detection device configured to detect current that flows in the first series circuit; and
   a discharge test execution device configured to apply a full-on gate voltage to a gate of the first switching element and apply a pulsed gate voltage to a gate of the second switching element so that a voltage of the gate of the second switching element increases gradually, and to set the gate voltages of the first and second switching elements to zero when the first current detection device has detected the current.

2. The inverter according to claim 1, wherein
   the discharge test execution device outputs a signal that changes a state of the first switching element and a state of the second switching element to a conducting state for a predetermined period, and outputs a signal that switches the state of one of the first switching element and the second switching element to a non-conducting state after the predetermined period has elapsed.

3. The inverter according to claim 1, wherein
   the discharge test execution device outputs a signal that operates the second switching element such that a resistance value of the second switching element in a conducting state is greater than a first resistance value and lower than a second resistance value,
   the first resistance value is a resistance value of the second switching element in the conducting state when a motor is driven,
   the second resistance value is a resistance value of the second switching element in a non-conducting state when the motor is driven, and
   the motor is connected to the inverter.

4. The inverter according to claim 1, wherein
the discharge test execution device supplies to the second switching element a control signal that causes a state of the second switching element to repeatedly change between a conducting state and a non-conducting state.

5. The inverter according to claim 1, further comprising:
a second series circuit that is connected in parallel to the first series circuit, the second series circuit including a third switching element and a fourth switching element connected in series; and
a second current detection device configured to detect current that flows in the second series circuit, wherein
the discharge test execution device outputs a signal that changes a state of the third switching element and a state of the fourth switching element to a conducting state, and
the discharge test execution device outputs, based on a detection result of the second current detection device, a signal that switches the state of one of the third switching element and the fourth switching element to a non-conducting state before predefined power flows in the third switching element.

6. The inverter according to claim 5, wherein
upon reception of a signal denoting a collision of a vehicle in which the discharge test execution device is installed, the discharge test execution device outputs a signal that changes a state of the first switching element of the first series circuit to the conducting state, and outputs a signal that changes the state of the third switching element to the conducting state.

7. The inverter according to claim 5, wherein
the first current detection device and the second current detection device are integrated into a single current detection device; and
the single current detection device detects current flowing in the first series circuit and current flowing in the second series circuit based on a timing at which current is detected.

8. The inverter according to claim 1, wherein
the discharge test execution device determines that an abnormality occurs in the first series circuit, when the pulsed gate voltage applied to the second switching element is increased up to an upper limit and the first current detection device does not detect current.

* * * * *